United States Patent [19]

Tsukada et al.

[11] Patent Number: 5,087,341
[45] Date of Patent: Feb. 11, 1992

[54] DRY ETCHING APPARATUS AND METHOD

[75] Inventors: Tsutomu Tsukada; Etsuo Wani, both of Fuchu; Koki Yasuda, Akita, all of Japan

[73] Assignee: ANELVA Corporation, Tokyo, Japan

[21] Appl. No.: 538,696

[22] Filed: Jun. 18, 1990

Related U.S. Application Data

[63] Continuation-in-part of Ser. No. 926,839, Nov. 3, 1986, abandoned, which is a continuation of Ser. No. 715,439, Mar. 25, 1985, abandoned.

[30] Foreign Application Priority Data

Mar. 23, 1984 [JP] Japan .................... 59-54476

[51] Int. Cl.$^5$ ...................... H01L 21/306; B44C 1/22; C03C 15/00
[52] U.S. Cl. .................... 204/192.32; 204/298.33; 156/643; 156/646; 156/345
[58] Field of Search ........... 156/345, 643, 646; 204/192.32, 192.35, 192.37, 298.31, 298.33, 298.39

[56] References Cited

U.S. PATENT DOCUMENTS

| | | | |
|---|---|---|---|
| 4,255,230 | 3/1981 | Zajac | 204/192 E X |
| 4,297,162 | 10/1981 | Mundt et al. | 204/298 X |
| 4,383,885 | 5/1983 | Maydan et al. | 204/192 E X |
| 4,384,918 | 5/1983 | Abe | 204/192 E X |
| 4,397,724 | 8/1983 | Moran | 204/192 E X |
| 4,399,016 | 8/1983 | Tsukada et al. | 156/345 X |
| 4,400,235 | 8/1983 | Coquin et al. | 204/298 X |
| 4,482,419 | 11/1984 | Tsukada et al. | 156/345 |

Primary Examiner—Nam X. Nguyen
Attorney, Agent, or Firm—Pollock, VandeSande & Priddy

[57] ABSTRACT

A dry etching apparatus with the use of reactive gas plasma is disclosed. The apparatus comprises a vacuum chamber, and first and second electrodes opposite to each other in the chamber for generating therebetween gas plasma by discharging while introducing reactive gas in the chamber thereby etching a sample placed on the first electrode. A cover member is provided for covering at least the periphery portion positioned at the outer side of the sample on the surface of the first electrode. The reactive gas introducer is provided on the second electrode at the position opposite to the sample thereby directing the gas to the sample.

12 Claims, 2 Drawing Sheets (a)         (b)

DRY ETCHING APPARATUS AND METHOD

This application is a continuation-in-part of Ser. No. 926,839, filed on Nov. 3, 1986, which is a continuation of Ser. No. 715,439, filed on Mar. 25, 1985, now both abandoned.

BACKGROUND OF THE INVENTION

The present invention relates to a dry etching apparatus for etching a substrate to be treated by reactive gas plasma.

When placing a substrate to be treated such as a wafer and the like on a high frequency electrode in a reactor chamber and applying dry etching thereto, an electrode portion which is not covered with the wafer has hitherto been covered with a suitable insulating material and the like for preventing contamination of impurities or improving selection ratio. As these cover materials, use was made of quartz, tetrafluoroethylene resin (trade name: Teflon), but if an aluminum film or polycrystalline silicon film on the wafer is dry etched, there is the disadvantage that an etching rate of each film becomes considerably large at the peripheral portion as compared with the center portion of the wafer. Therefore, it is difficult to obtain uniform etching rate in the wafer, the wafer peripheral portion is over-etched, and thus the narrow portion of a pattern and a base thereof tend to receive damages.

In the dry etching apparatus of this kind, the reason why the etching rate around the periphery of a wafer is large is because reactive gas and its active seed or ion (hereinafter referred to as etchant) which contributed to etching is largely consumed on the wafer during etching, and a concentration of the etchant around the center and the periphery of the wafer becomes graded. Therefore, the etching rate is large at the periphery of the wafer having the large concentration.

SUMMARY OF THE INVENTION

It is an object of the present invention to overcome the above described disadvantages of the conventional dry etching apparatus.

It is another object of the invention to provide a dry etching apparatus for uniformly etching a sample by homogenizing the concentration of an etchant over the whole area on the sample.

According to the present invention there is provided a dry etching apparatus comprising a vacuum chamber under vacuum atmosphere, first and second electrodes opposite to each other arranged in the chamber, the first and second electrodes generating therebetween gas plasma by discharging while introducing reactive gas in the chamber, thereby etching a sample placed on a first surface opposite to the second electrode of the first electrode, a cover member for surrounding and covering at least a peripheral portion positioned at a outer side of the sample on the first opposite surface of the first electrode, and means for supplying the reactive gas which is provided on the second surface opposite to the first electrode of the second electrode at the position opposite to the sample thereby directing the reactive gas to the sample.

The cover member consists of a material for reducing etchant generated from the gas plasma of the reactive gas, i.e. chemically absorbing the etchant. When surrounding the sample, the top main surface of the cover does not lie in the same plane as the top surface of the sample. The cover member may be made from electrical conductive materials.

There is also provided a dry etching apparatus comprising a reactor chamber, a supporting electrode provided in the chamber for supporting a plurality of substrates to be processed thereon in symmetry of rotation, an opposite electrode opposite to the supporting electrode arranged in the chamber thereby etching the substrate by applying high frequency power between both electrodes, a cover member for covering at least a peripheral portion positioned at the outer side of the substrates to be treated on the surface of the supporting electrode, and means for supplying reactive gas which is provided to the opposite electrode at the position immediately above the substrates to be treated, thereby intermittenly rotating the supporting electrode around the symmetrical axis of rotation by a certain angle and stopping the substrate substantially immediately beneath the gas supplying means for a certain time.

BRIEF DESCRIPTION OF THE DRAWING

These and other features and advantages of the present invention will become readily apparent from the following detailed description of one embodiment of the present invention, particularly when taken in connection with the accompanying drawings wherein like reference numerals designate like or functionally equivalent parts throughout, and wherein.

THE RELATED-ART DEVICE EXPLAINED

Figure 1:
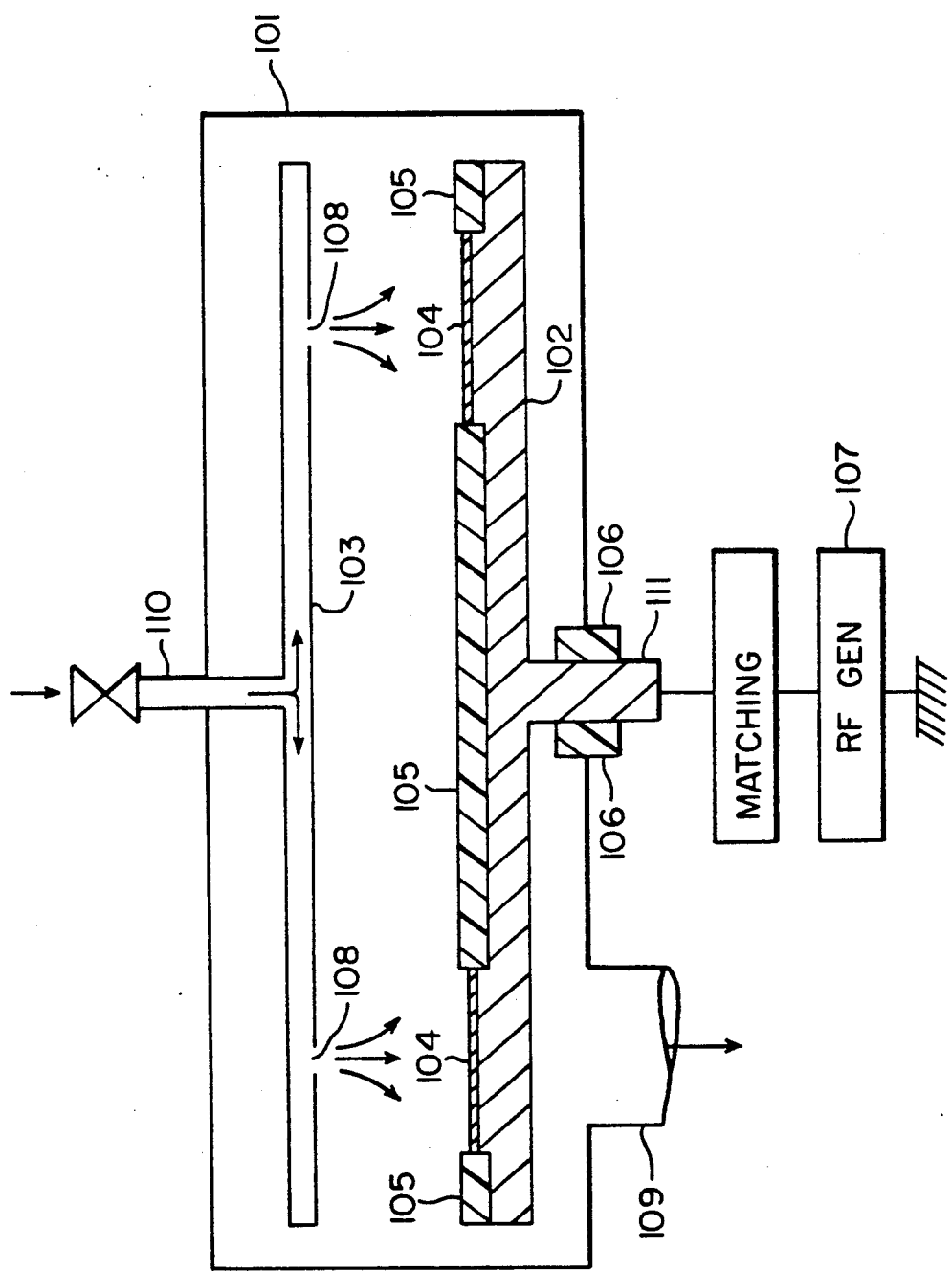
FIG. 1 is a cross-sectional view showing one embodiment of a dry etching apparatus according to the present invention.

A supporting or carrier electrode 102 for placing a wafer 104 thereon and an opposite or counterelectrode 103 in parallel to each other are arranged in a reactor chamber 101. A plurality of wafers 104 are concentrically placed on the supporting electrode 102 as substrates to be treated. At the outer periphery of the wafers 104, the supporting electrode 102 is covered with a quartz or an anodic oxidized aluminum film. The supporting electrode 102 is positioned in the vacuum, so that it can be rotated around an axis 111 with the use of a feed through (an insulator) 106. A high frequency voltage is applied between the supporting electrode 102 and the opposite electrode 103 having the same potential as the reactor chamber 101 from a high frequency power source 107. The opposite electrode 103 is provided with gas supplying holes 108 for introducing reactive gas into the reactor chamber.

When actually etching an aluminum film by the dry etching apparatus described above, the following manner is employed. The wafer 104 coated with the aluminum film is conveyed to a predetermined position on the supporting electrode 102 with the use of an automatic conveyor and the like, and thereafter the inside of the reactor chamber 101 is exhausted through an exhaust conduit 109. Then, reactive gas mainly consisting of a mixed gas of $BCl_3$ and $Cl_2$ is introduced from a reactive gas inlet pipe 110 through the gas outlet hole. The reactive gas is injected toward each wafer 104 and exhausted through the exhaust conduit 109. In this case, a conductance of the exhaust conduit 109 is adjusted, and a pressure in the reactor chamber 101 is set to a predetermined pressure. In this condition, if a high frequency electric power is applied between the supporting electrode 102 and the opposite electrode 103 by the high frequency power source 107, reactive gas plasma is generated by discharge, and aluminum on the surface of the wafer 104 can be etched by the thus generated etchant. After the thin oxide film on the aluminum surface is etched, the etchant of the aluminum film is considered to be an activated chlorine, and the etching rate in the wafer depends upon the concentration of the etchant.

In the conventional apparatus, adjacent to the periphery of the wafer 104 on the supporting electrode 102 is covered with the material which hardly consumes the etchant, such as quartz or an anodic oxidized aluminum film. Consequently the supply amount of the etchant becomes increased around the periphery of the wafer. Therefore, concentration distribution of active seeds is produced in the surface of the wafer, and there is recognized such phenomenon that the etching rate of aluminum at the center portion of the wafer is lowered as compared with the peripheral portion.

Further, in the conventional apparatus, there is used a method of continuously rotating the supporting electrode 102 for the purpose of improving uniformity of the etching rate between wafers. Generally, the gas supplying hole 108 is provided at the center or the periphery of the opposite electrode 103 shown in FIG. 1a, so that gas is uniformly injected or supplied to every portion of the wafer in the rotating direction of the electrode, and the supply amount of the etchant becomes almost uniform over the whole surface of the wafer. Therefore, the concentration of the etchant is lowered at the center of the wafer during etching aluminum, and it is difficult to improve uniformity in the surface of each wafer. On the other hand, if the supporting electrode 102 is fixed during etching, and the wafer 104 is at a fixed position on the supporting electrode 102, a local difference is produced in the flow of gas to each wafer by the position of the gas supplying hole 108, its hole diameter, slightly different hole shape, position occupied by the exhaust conduit 109, and disorder of parallelism of the electrodes 102, 103 and there is the possibility of making the etching rate between wafers non-uniform.

DESCRIPTION OF THE PREFERRED EMBODIMENT

Refer now to FIG. 1 of the drawings, which show a dry etching apparatus according to the present invention.

In FIG. 1, there is shown a parallel flat plate type dry etching apparatus as one embodiment of the invention. The construction and operation or function of the dry etching apparatus are already described in the explanation of the related art device so that the detailed explanation thereof is omitted. In the present invention the surface of the supporting electrode 102 in the periphery of the wafer (substrate) 104 is covered with a cover 105 made of superhigh molecular weight polyethylene resin (trade name: New Light) as one of polyolefin resins performing a role of reducing reaction seed generated by reaction gas plasma. The opposite electrode 103 is provided with gas supplying holes 108 for introducing reactive gas into the reactor chamber 101 at the center portion of each wafer immediately above each wafer 104 one by one. The number of gas supplying holes are selected as four for 6 inch $\phi$ wafer and as one for 5 inch $\phi$ wafer.

In the invention, since a cover 105 of superhigh molecular polyethylene resin such as New Light and the like is used at the peripheral portion of the wafer, the etchant is chemically absorbed by the cover 105 of this New Light and the like, and the etchant concentration at the peripheral portion of the wafer can be lowered. Therefore, the concentration distribution of the etchant in the surface of the wafer is unified, and the uniformity of the etching rate in the wafer can be improved. For example, as shown in FIG. 1, the top main surface of cover 105 is higher than the top main surfaces of substrates 104.

Further, in the invention, the supporting electrode 102 is intermittently rotated, and each wafer is stopped immediately below the gas supplying hole 108, so that new gas is incessantly supplied from immediately above the wafer; the etchant supply amount to the wafer center portion, where consumption of the etchant is great during etching aluminum, is increased, the etching rate at the center portion of the wafer can be close to that at the peripheral portion, or reversed according to the condition. Moreover, the supporting electrode 102 is intermittently rotated at a certain angle and each wafer is stopped immediately below the gas supplying holes 108 for a certain time, so that the uniformity of the etching rate between wafers can be improved in the same manner as in the case of continuously rotating the electrode without any influence upon the local gas flow in the reactor chamber 101.

Figure 2:
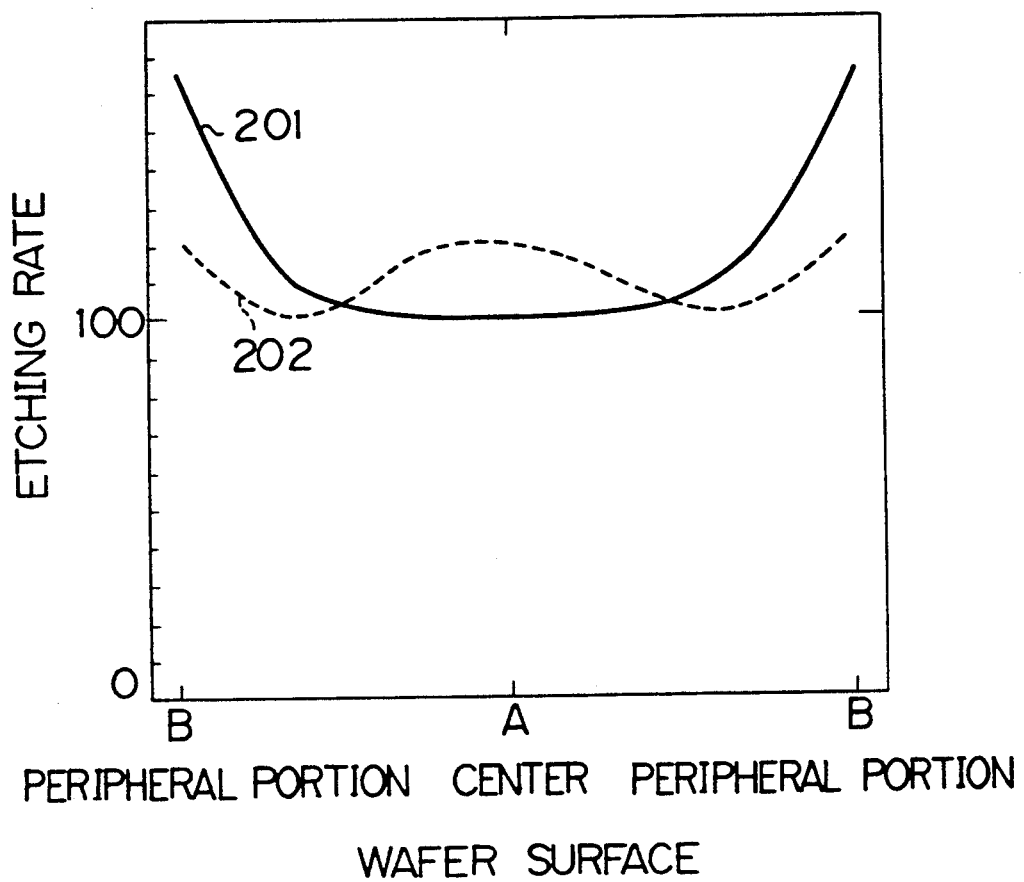
FIG. 2 shows distribution of etching rates in wafers according to the dry etching apparatus shown in FIG. 1 and the conventional dry etching apparatus.

FIG. 2 shows difference in uniformity of an etching rate in wafers when an aluminum film is etched in case of using the apparatus according to the invention shown in FIG. 1 and the conventional system. A solid line 201 shows an etching rate distribution in the surface by the conventional apparatus, and a broken line 202 shows an etching rate distribution in the surface according to the present apparatus. In the conventional apparatus in which the periphery of the wafer on the supporting electrode is covered with quartz, and the supporting electrode is continuously rotated, the etching rate is abnormally high at the peripheral portion of the wafer, and unevenness of the etching rate from the end of 125 mm$\phi$ wafer to the position B of 5 mm and the center A reaches $\pm 24\%$. On the other hand, in case of using the apparatus according to the invention, it is possible to make the etching rate at the wafer center portion substantially equal to that at the wafer peripheral portion B. Therefore, the uniformity in the wafer can be improved to less than $\pm 5\%$ from the end of 125 mm$\phi$ wafer within 5 mm.

Figure 3:
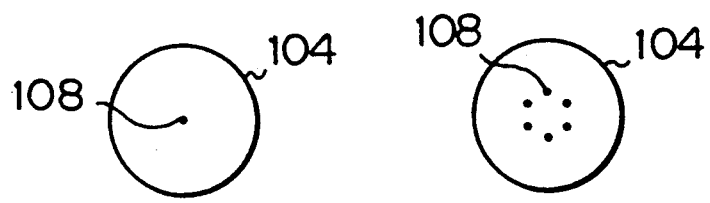
FIGS. 3a and 3b are plan views showing relative positions of the wafer and the gas supplying means (holes), respectively.

FIG. 3 is an explanatory view showing a relation between each wafer 104 and the gas supplying hole 108 arranged immediately above in the apparatus shown in FIG. 1. FIG. 3a which corresponds to FIG. 1a shows the case of providing each one gas supplying hole 108 at the center portion of the wafer immediately above each wafer 104. FIG. 3b shows the case of providing six gas supplying holes 108 circumferentially about the center portion of the wafer 104, such that the center of the circumference formed by the gas supplying holes is positionable above the center of each wafer, for increasing the uniformity of the etching rate in the wafer. This embodiment is shown in FIG. 1b. Further, when a continuous uniform porous material is used in a part of the opposite electrode 103 immediately above the wafer 104 and gas is injected or supplied from the whole surface, etching of higher uniformity can be possible. That is, the gas supplying hole in the invention can variously be used without any limitation in shape, arrangement, amount and the like except that it is immediately above the wafer.

In the present embodiment, superhigh molecular weight polyethylene resin was used as the cover 105, but it may be preferable to use any material which can chemically absorb, i.e. reduce the active seed, or etchant or can easily be reached with the active seed. For example, use may be made of polyolefin resin other than polyethylene resin, polysulfon resin, high molecular material such as polyarylate resin and the like, carbon, monocrystal or polycrystal silicon, silicon carbide, inorganic matter including metal such as aluminum and the like. It is also preferable to cover the whole surface of the supporting electrode 102 with the cover 105. The invention may also be applied to one wafer treating apparatus. In this case intermittent rotation of the supporting electrode is lessened or may not be performed. In the latter case, the uniformity of the etching rate is the same manner as in the case of intermittently rotating the electrode.

In the above-described embodiment, there was explained the case of applying two disc-like electrodes in parallel to each other to a parallel flat-sheet type dry etching apparatus but the shape of the electrode is not limited to this embodiment. For example, the dry etching apparatus according to the invention can be used in such an embodiment that a plurality of supporting electrodes are made into long strip-shaped so as to compose a polygonal electrode with the use of these faces, opposite electrodes are arranged around the polygonal electrode, and gas introducing holes are arranged in opposite electrodes positioned in the face of wafers placed on each long strip-shaped supporting electrodes. In this case, the polygonal electrode can intermittently be rotated around the axis of the columnar surface.

The materials to be etched by the apparatus according to the invention are not only aluminum but also metal such as polysilicon, molybdenum and the like and silicide thereof. These materials are electrical conductors. Further, the reaction seed is not limited to chlorine but other halogen and the halide.

As explained above, according to the invention, there is an effect of unifying a concentration of an etchant over the whole area on a sample and uniformly etching the sample by covering at least a peripheral portion of the sample on a first electrode placed on the sample with a cover made of a material which can reduce the etchant produced by reactive gas plasma.

What is claimed is:

1. A dry etching apparatus comprising:
   a reactor chamber;
   a first electrode provided in said reactor chamber for supporting a plurality of to be treated substrates;
   a second electrode positioned opposite to said first electrode;
   means provided to said second electrode for supplying reactive gas into said reactor chamber; and
   means for applying high frequency power between said first electrode and said second electrode for generating etchant from said reactive gas to etch said substrates;
   the improvement comprising:
   (a) means intermittently rotating said first electrode for positioning each of said substrates substantially directly beneath said gas supplying means for a predetermined period of time such that said reactive gas, and therefore etchant generated from said reactive gas, is directly blown onto the surface of each of said substrates during said period of time; and
   (b) means for reducing etchant surrounding each of said substrates which is designed such that
   (i) at least a portion of said first electrode adjacent respective peripheries of said substrates is covered with said etchant reducing means; and
   (ii) a top main surface of said etchant reducing means is higher than top surfaces of said substrates.

2. A dry etching apparatus as claimed in claim 1, wherein said gas supplying means comprises at least one hole integrated to said second electrode such that said hole is positionable above the center portion of each of said substrates.

3. A dry etching apparatus as claimed in claim 1, wherein said gas supplying means comprises a plurality of holes integrated to said second electrode, said holes disposing circumferentially about said second electrode and the center of said circumferentially disposed holes is positioned above the center portion of each of said substrates.

4. A dry etching apparatus as claimed in claimed in 1, wherein said etchant reducing means comprises an electrode cover made of a material capable of chemically absorbing etchant.

5. A dry etching apparatus as claimed in claim 4, wherein said electrode cover is made of high molecular weight polyethylene resin.

6. A dry etching apparatus as claimed in claim 4, wherein said electrode cover is made of polyolefin resin.

7. A dry etching apparatus as claimed in claim 4, wherein said electrode cover is made of polysulfon resin.

8. A dry etching apparatus as claimed in claim 4, wherein said electrode cover is made of carbon.

9. A dry etching apparatus as claimed in claim 4, wherein said electrode cover is made of monocrystal or polycrystal silicon.

10. A dry etching apparatus as claimed in claim 4, wherein said electrode cover is made of silicon carbide.

11. A dry etching apparatus claimed in claim 4, wherein said electrode cover is made of aluminum.

12. In a dry etching process carried out by using an apparatus which comprises:
    a reactor chamber;
    a first electrode provided in said reactor chamber for supporting a plurality of to be treated substrates;
    a second electrode positioned opposed to said first electrode;
    means provided to said second electrode for supplying reactive gas into said reactor chamber;
    means for applying high frequency power between said first electrode and said second electrode;
    means for intermittently rotating said first electrode; and
    etchant reducing means a top main surface of which is higher than top surfaces of said substrates and with which at least a portion of said first electrode adjacent respective peripheries of said substrates is covered;
    the improvement comprising:

(a) intermittently rotating said first electrode for positioning each of said substrates substantially directly beneath said gas supplying means for a predetermined period of time such that said reactive gas, and therefore etchant generated from said reactive gas, is directly blown onto the surface of each of said substrates during a period of time; and (b) reducing etchant which exists around each of said substrates with said etchant reducing means so that the concentration of the etchant across the surface of each of said substrates is uniformly effected.

* * * * *

UNITED STATES PATENT AND TRADEMARK OFFICE
CERTIFICATE OF CORRECTION

PATENT NO. : 5,087,341
DATED : February 11, 1992
INVENTOR(S) : Tsutomu Tsukada, et al.

It is certified that error appears in the above-identified patent and that said Letters Patent is hereby corrected as shown below:

Col. 2, line 16, change "intermittenly" to --intermittently--.

Column 4, line 56, change "1a" to --1--;

line 65, change "1b" to --1--.

Signed and Sealed this

Third Day of August, 1993

Attest:

MICHAEL K. KIRK

*Attesting Officer*     *Acting Commissioner of Patents and Trademarks*